US 6,646,480 B2

(12) United States Patent
Weng et al.

(10) Patent No.: US 6,646,480 B2
(45) Date of Patent: Nov. 11, 2003

(54) GLITCHLESS CLOCK OUTPUT CIRCUIT AND THE METHOD FOR THE SAME

(75) Inventors: Chih Hsien Weng, Miaoli (TW); Cheng-Yuan Wu, Pu Tzu (TW); Chen-Hua Hsi, Hsin Tien (TW)

(73) Assignee: Via Technologies, Inc., Hsin Tien (TW)

( * ) Notice: Subject to any disclaimer, the term of this patent is extended or adjusted under 35 U.S.C. 154(b) by 0 days.

(21) Appl. No.: 10/151,923

(22) Filed: May 22, 2002

(65) Prior Publication Data

US 2003/0006808 A1 Jan. 9, 2003

(30) Foreign Application Priority Data

Jul. 6, 2001 (TW) ........................................ 90116572 A

(51) Int. Cl.[7] .............................................. H03K 17/00
(52) U.S. Cl. .......................................... 327/99; 327/276
(58) Field of Search ........................... 327/99, 298, 293, 327/294, 296, 407, 276, 277, 284

(56) References Cited

U.S. PATENT DOCUMENTS

| 4,853,653 A | * | 8/1989 | Maher ........................... 331/49 |
| 4,970,405 A | * | 11/1990 | Hagiwara .................... 327/145 |
| 5,315,181 A | * | 5/1994 | Schowe ......................... 326/93 |
| 5,623,223 A | * | 4/1997 | Pasqualini .................... 327/298 |
| 5,973,523 A | * | 10/1999 | Kusumoto et al. ........... 327/146 |
| 6,014,063 A | * | 1/2000 | Liu et al. ...................... 331/78 |
| 6,025,747 A | * | 2/2000 | Okayasu et al. ............. 327/407 |
| 6,392,456 B1 | * | 5/2002 | Pyeon et al. ................. 327/156 |

* cited by examiner

Primary Examiner—Timothy P. Callahan
Assistant Examiner—Cassandra Cox
(74) Attorney, Agent, or Firm—Bacon & Thomas, PLLC

(57) ABSTRACT

A circuit and a method for generating a variable delay clock without glitches are provided. A DLL clock output circuit comprises a selection circuit. A plurality of select signals selectively switch the corresponding clock delay lines to be the output signal by the selection circuit. Each of the select signals traverses through a delay switching circuit to adaptively delay the time points at which the select signals switch the clock delay lines to the output signal, so as to produce a glitchless variable delay clock signal.

16 Claims, 5 Drawing Sheets

| SEL_N(t) | CLK_N(t) | SEL'_N (t) | SEL'_N (t⁺) |
|---|---|---|---|
| L | L | L | L |
| L | L | H | L |
| L | H | L | L |
| L | H | H | H |
| H | L | L | L |
| H | L | H | H |
| H | H | L | H |
| H | H | H | H |

Fig 6

GLITCHLESS CLOCK OUTPUT CIRCUIT AND THE METHOD FOR THE SAME

BACKGROUND OF THE INVENTION

1. Field of Invention

The present invention relates to eliminating glitches caused by clock switching, more particularly, to a circuit design used in a delay-locked loop (DLL) to eliminate glitches for clock outputs and a method that prevents glitches of a variable delay clock selected from a plurality of clock delay lines.

2. Related Art

Clock signals are the synchronization basis of a digital logic circuit. Different logic operations will be concurrently performed at each transition of the clock. Therefore, the operation results of the digital logic circuit will not be predictable if those logic operations cannot concurrently performed at the transitions.

In digital circuit designs, clock signals are always spread to many logic units, such as an adder, a subtracter, a multiplier, a multiplexer, and a shifter. However, when the signal lines are too long, different receiving ends of the signal lines may have many different phases with respect to the original clock signal source from the clock generator. Thus, the logic units cannot perform operations at the same time, resulting in unpredictable results. To solve the problem caused by clock delays, a DLL is utilized to minimize the clock phase differences, so that each logic unit can perform operations at the same time.

With reference to FIG. 1, in the clock output circuit of a DLL in the prior art, the input signal CNT can be used to switch different clock delay lines CLK_N, CLK_N+1 to an output signal CLKO in response to an input signal CNT through a selection circuit 1, so that the output signal CLKO is a variable delayed clock signal. When the input signal CNT is N, only the select signal SEL_N output from the selection circuit 1 is High, while the other select signals are Low. The clock delay line CLK_N passes through an AND gate 2 and an OR gate 4 to generate the output signal CLKO. When the input signal CNT is N+1, only the select signal SEL_N+1 output from the selection circuit 1 is High, while the other select signals are Low. The clock delay line CLK_N+1 passes through an AND gate 3 and an OR gate 4 to generate the output signal CLKO accordingly.

When the input signal CNT transits from N to N+1 or from N+1 to N, if the transition time falls within the clock delay interval or phase difference of the delay lines CLK_N and CLK_N+1, then glitches 5 will happen in the output signal CLKO, as shown in FIGS. 2A and 2B. In other words, the select signals SEL_N and SEL_N+1 in the selection circuit 1 are switched within the clock delay interval or phase difference of the clock delay lines CLK_N and CLK_N+1. Glitches will cause problems in the output signal CLKO. Such a clock with glitches will fail the logic circuit. The invention provides a circuit and method that eliminate glitches in a DLL during clock switching.

SUMMARY OF THE INVENTION

A primary objective of the invention is to provide a circuit and method that eliminate the glitches in the clock output circuit of a DLL (Delay-Locked Loop) by adaptively delaying the switching time of the select signal.

Another objective of the invention is to provide a method that generates a variable delay clock. The method selects from a plurality of clock delay lines to send out an output signal without glitches by delaying the switching time.

A further objective of the invention is to provide a circuit and method that utilize the rising edge or the falling edge of the clock of the clock delay line as the switching time of a variable delay clock in the clock output circuit of a DLL.

In view of the problem that generating glitches at the select signal switching time by the clock output signal may cause digital modules or systems to have incorrect operations, the invention provides a clock output circuit and a method for generating a variable delay clock in a DLL. The clock rising edge or the clock falling edge of the clock delay line is utilized as the switching time of the variable delay clock to eliminate the glitches in the clock output signal.

In an embodiment of the invention, the DLL clock output circuit contains a selection circuit. A plurality of select signals switch the corresponding clock delay lines to the output signal, wherein each select signal properly delays the time point which the select signal switches the clock delay line to the output signal by passing through a delay switching circuit, so as to produce a variable delayed clock signal without glitches.

BRIEF DESCRIPTION OF THE DRAWINGS

The present invention will become more fully understood from the detailed description given hereinafter, said description being by way of illustration only and thus is not limitative of the present invention; wherein:

FIG. 6 lists a truth table of the delay switching circuit in FIG. 5.

DETAILED DESCRIPTION OF THE INVENTION

Figure 1:
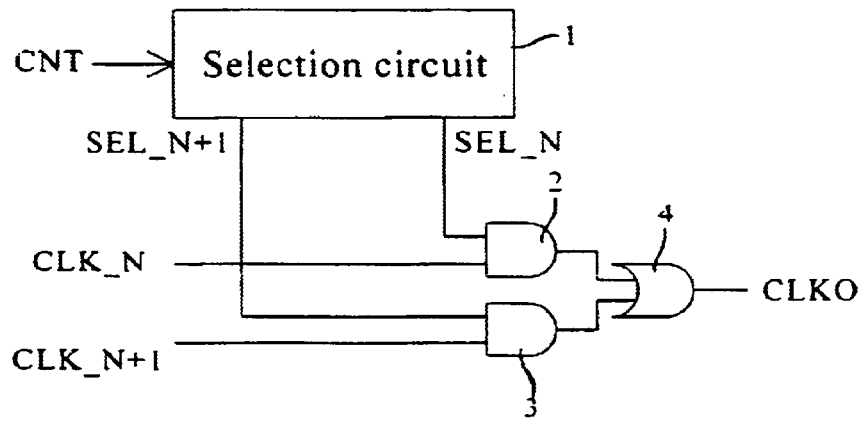
FIG. 1 shows a clock output circuit of a conventional DLL.
Figure 2A:
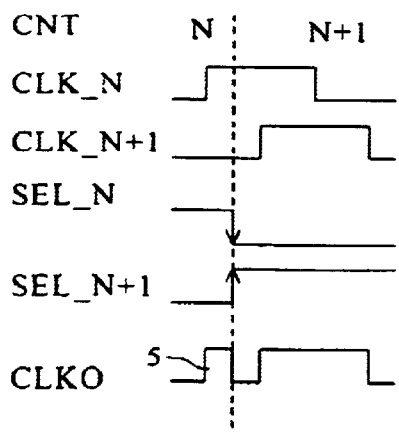
FIGS. 2A and 2B show the output signal waveforms with glitches produced by the clock output circuit in FIG. 1.
Figure 2B:
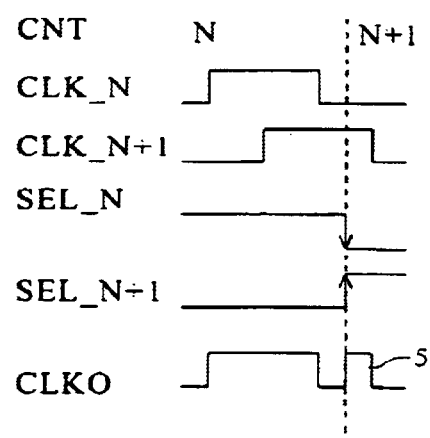
Figure 3:
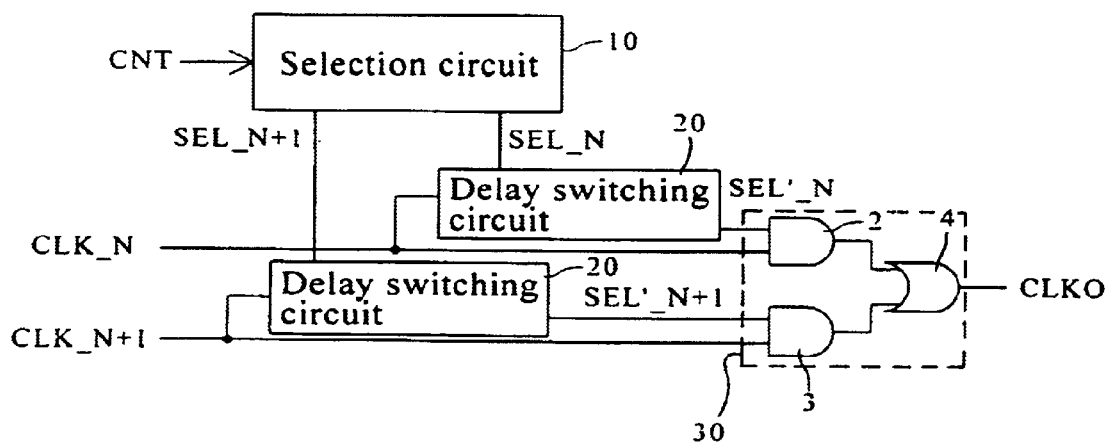
FIG. 3 is a clock output circuit of the DLL according to the present invention.

With reference to FIG. 3, the DLL (Delay-Locked-Loop) clock output circuit of the invention includes a selection circuit 10 and a router circuit 30 that includes AND gates 2,3, and OR gate 4. The selection circuit 10 selectively enables a plurality of select signals SEL_N and SEL_N+1 in response to an input signal CNT. Delay switching circuit 20 receives select signals SEL_N and SEL_N+1 and outputs select enabling signals SEL'_N1 and SEL'_N+1 to the router circuit 30. The router circuit 30 receives the plurality of select signals SEL '_N+1 and SEL'_N1 and switches the corresponding clock delay lines CLK_N and CLK_N+1 to the output signal CLKO. The select signals SEL_N and SEL_N+1 are therefore couples to a delay switching circuit 20, adaptively switching the clock delay lines CLK_N and CLK_N+1 to the output signal CLKO. This invention is thus capable of producting a variable delayed clock signal output CLKO without any glitch 5.

Figure 4A:
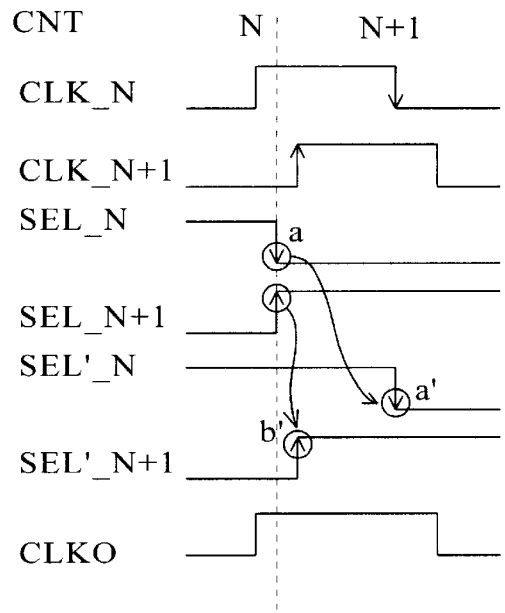
FIGS. 4A and 4B show the clock output signal waveforms according to the present invention.

Each delay switching circuit 20 implemented in the above embodiment produces a selection enabling signal SEL'. As shown in FIG. 4A, when the output signal CNT transits from N to N+1 within the clock delay time or phase difference of the clock delay lines CLK__N and CLK__N+1, the select signal SEL__N transits from logic H to logic L at time a and the signal SEL__N+1 from logic L to logic H. The selection enabling signal SEL'__N does not disable the clock delay line CLK__N output to the signal CLKO until the falling edge of the current clock of the corresponding clock delay line CLK__N. That is, the selection enabling signal SEL'__N transits from logic H to logic L at time a'. On the other hand, the selection enabling signal SEL'__N+1 is not asserted until the rising edge on the corresponding clock delay line CLK__N+1 in order to switch the clock delay line CLK__N+1 output to the signal CLKO. That is, the selection enabling signal SEL'__N+1 transits from logic L to logic H at time b'. Therefore, the signal CLKO is identical to the clock delay line CLK__N before the transition point a. After the transition point a, the signal CLKO is identical to the clock delay line CLK__N+1; thus, no glitches will occur in the signal CLKO.

Figure 4B:
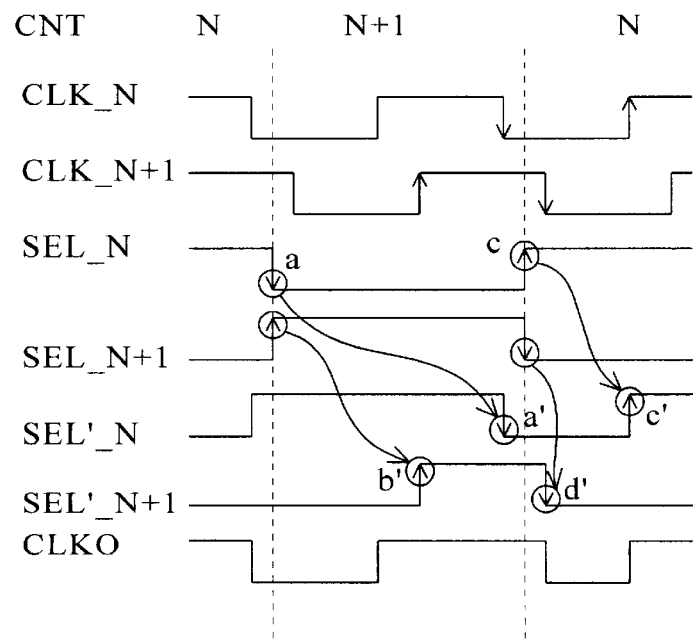

With reference to FIG. 4B, when the input signal CNT continuously transits from N to N+1 and then from N+1 to N within the clock delay time or phase difference of the clock delay lines CLK__N and CLK__N+1, the select signal SEL__N transits from logic H to logic L and the select signal SEL__N+1 from logic L to logic H at time a. The selection enabling signal SEL'__N is asserted till the following falling edge on the clock delay line CLK__N, i.e. time a' to disable the clock delay line CLK__N output to the signal CLKO. That is, the selection enabling signal SEL'__N transits from logic H to logic L at time a'. On the other hand, the clock delay line CLK__N+1 signal is switched to the signal CLKO at the following rising edge of the clock on the clock delay line CLK__N+1, i.e. time b', in response to the selection enabling signal SEL'__N+1. That is, the selection enabling signal SEL'__N+1 transits from logic L to logic H at time b'.

At time c, the select signals SEL__N and SEL__N+1 change from logic L to logic H and from logic H to logic L, respectively. The selection enabling signal SEL'__N is not asserted until the rising edge of the next clock of the clock delay line CLK__N, i.e. time c', to switch the clock delay line CLK__N output to the signal CLKO. That is, the selection enabling signal SEL'__N transits from logic L to logic H at time c'. The selection enabling signal SEL'__N+1 is not deasserted until the following falling edge of the clock on the clock delay line CLK__N+1 to disable the clock delay line CLK__N+1 output to the signal CLKO. That is, the selection enabling signal SEL'__N+1 transits from logic H to logic L at time d', so as to mask the signal of CLK__N+1 from signal CLKO after time d'. Therefore, the signal CLKO does not have glitches.

Figure 5:
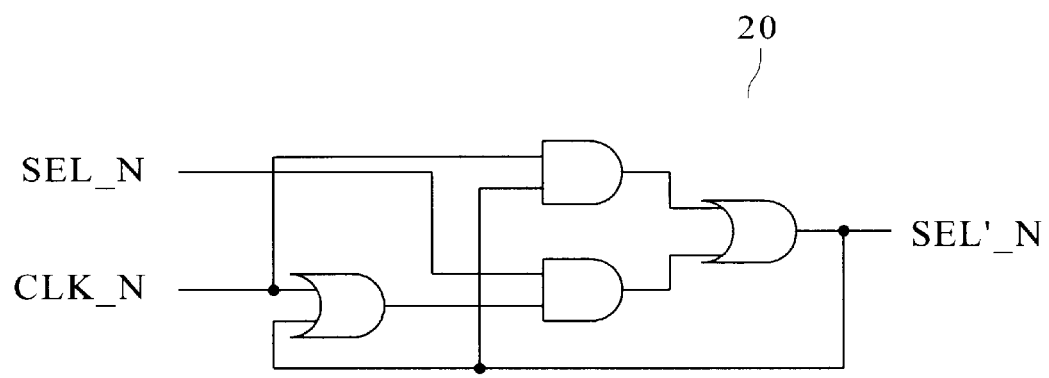
FIG. 5 is a delay switching circuit according to one embodiment of the invention.

In accordance with the invention, FIG. 5 shows an embodiment of the delay switching circuit 20 which adaptively delays the switching timing for the select signals, so that the clock delay lines are selectively switched to the output signal without glitches. The input signals of the delay switching circuit 20 are the clock delay line CLK__N and the select signal SEL__N. The selection enabling signal SEL'__N output from the delay switching signal 20 is fed back to be an input signal. The truth table is given in FIG. 6.

According to the truth table, when the select signal SEL__N(t) is in a steady state, so is the selection enabling signal SEL'__N(t). That is, when the select signal SEL__N(t) is kept at logic L or logic H, so is the selection enabling signal SEL'__N(t), without being affected by the clock delay line CLK__N(t). When the select signal SEL__N(t) transits from logic H to logic L, the selection enabling signal SEL'__N(t) is kept at its original state until the clock delay line CLK__N(t) transits from logic H to logic L. The selection enabling signal SEL'__N(t) thus transits ($t^- \to t^+$) from logic H to logic L. When the select signal SEL__N(t) transits from logic L to logic H, the selection enabling signal SEL'__N(t) is kept at its original state until the clock delay line CLK__N(t) transits from logic L to logic H. The selection enabling signal SEL'__N(t) then transits ($t^- \to t^+$) from logic L to logic H.

In conclusion, the invention provides a method of generating variable delay clocks, which adaptively delays the switching timing of the select signals in the selection circuit and selects a signal from a plurality of clock delay lines as the output without glitches. There is substantially the same predetermined phase delay between every two neighboring clock delay lines. The method includes the following steps: When enabling a clock delay line as the output signal, the corresponding select signal is not asserted until the following rising edge of the clock on the clock delay line to switch the clock delay line to the output signal. When disabling a clock delay line as the output signal, the corresponding select signal is not deasserted until the following falling edge of the clock on the clock delay line to disable the clock delay line to the output signal. Enabling or disabling the clock delay lines is achieved by a digital logic operation that selects the clock delay line to the output signal or disables the clock delay line from the output signal.

In another embodiment of the invention, the present invention discloses a method for generating a variable delay clock by adaptively selecting from a plurality of delayed clock signals as an output signal. The delayed clock signals have substantially the same predetermined delay time. This method includes the following steps: select one of the delayed clock signals as the output signal at the rising edge of the selected delayed clock signal and mask the selected delayed clock signal at the falling edge of the selected delayed clock signal. Selecting or masking the delayed clock signal is achieved using a digital logic operation so that one of the delayed clock signals is adaptively connected to the output signal or the selected delayed clock signal is removed from the output signal.

Effects of the Invention

According to the invention, a variable delayed clock signal is generated from the clock output circuit of the DLL or from a plurality of clock delay lines to eliminate glitches, which might be generated at the switching time points of the select signals to cause unpredictable results in the operations of digital logic circuits or modules. Therefore, the disclosed circuit and method can be widely applied to clock generators and clock output circuits in the digital logic circuit design.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the scope of the invention.

What is claimed is:

1. A glitchless clock output circuit, which comprises:
   a selection circuit, which generates a plurality of select signals according to an input signal;
   a plurality of delay switching circuits, each of which receives the select signal and a corresponding delayed clock signal and generates a select enabling signal such that the transition of the select enabling signal is synchronized with the transition of the corresponding delayed clock signal; and
   an adaptive clock router circuit for selecting one of the delayed clock signals as a clock output signal according to a plurality of select enabling signals, wherein the delay switching circuit comprises:
a first AND gate for receiving the delayed clock signal and the select enabling signal;
a first OR gate for receiving the delayed clock signal and the select signal enabling;
a second AND gate for receiving the select signal and the output of the first OR gate; and
a second OR gate for receiving the outputs of the first and second AND gates and outputting the select enabling signal.

2. The circuit of claim 1, wherein one of the plurality of select signals is logic H and the remaining select signals are logic L.

3. The circuit of claim 1, wherein each of the selection enabling signals makes a transition at the rising edge of the corresponding delayed clock signal.

4. The circuit of claim 1, wherein each of the selection enabling signals makes a transition at the falling edge of the corresponding delayed clock signal.

5. The circuit of claim 1, wherein the transition of each of the selection enabling signals is made after the corresponding delayed clock signal makes its transition.

6. The circuit of claim 5, wherein each of the selection enabling signals transits from logic H to logic L after the corresponding delayed clock signal transits from logic H to logic L.

7. The circuit of claim 5, wherein each of the selection enabling signals transits from logic L to logic H after the corresponding delayed clock signal transits from logic L to logic H.

8. The circuit of claim 5, wherein the adaptive clock router circuit is composed of AND gates and one OR gate, and AND gate receives of select enabling signals and a corresponding delayed clock signal, and the OR gate receives the outputs of the AND gates and outputs the clock output signal.

9. A glitchless clock output circuit, comprising:
a plurality of delayed clock signals, each of which has a predetermined delay time with another delayed clock signal of said delayed clock signals;
a plurality of select signals respectively corresponding to the delayed clock signals;
an adaptive clock router circuit for selecting one of the delayed clock signals as a clock output signal according to one of a plurality of select enabling signals; and
a plurality of delay switching circuits for generating the select enabling signals, each delay switching circuit comprising:
a first AND gate for receiving the delayed clock signal and the select enabling signal;
a first OR gate for receiving the delayed clock signal and the select enabling signal;
a second AND gate for receiving the select signal and the output of the first OR gate; and
a second OR gate for receiving the outputs of the first and second AND gates and outputting the select enabling signal.

10. The circuit of claim 9, wherein the one of the plurality of select signals is logic H and the remaining select signals are logic L.

11. The circuit of claim 9, wherein each of the select enabling signals makes a transition at the rising edge of the corresponding delayed clock signal.

12. The circuit of claim 9, wherein each of the select enabling signals makes a transition at the falling edge of the corresponding delayed clock signal.

13. The circuit of claim 9, wherein each of the select enabling signals is made after the corresponding delayed clock signal makes its transition.

14. The circuit of claim 13, wherein each of the select enabling signals transits from logic H to logic L after the corresponding delayed clock signal transits from logic H to logic L.

15. The circuit of claim 13, wherein each of the selection enabling signals transits from logic L to logic H after the corresponding delayed clock signal transits from logic L to logic H.

16. The circuit of claim 9, wherein the adaptive clock router circuit is composed of AND gates and one OR gate, each AND gate receives one of select enabling signals and a corresponding delayed clock signal, and the OR gate receives the outputs of the AND gates and outputs the clock output signal.

* * * * *